(12) United States Patent
Marconi et al.

(10) Patent No.: US 7,705,332 B2
(45) Date of Patent: Apr. 27, 2010

(54) NANOMETER-SCALE LITHOGRAPHY USING EXTREME ULTRAVIOLET/SOFT X-RAY LASER INTERFEROMETRY

(75) Inventors: Mario C. Marconi, Fort Collins, CO (US); Przemyslaw W. Wachulak, Fort Collins, CO (US); Carmen S. Menoni, Fort Collins, CO (US); Jorge J. Rocca, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 297 days.

(21) Appl. No.: 11/840,890

(22) Filed: Aug. 17, 2007

(65) Prior Publication Data
US 2008/0175348 A1 Jul. 24, 2008

Related U.S. Application Data

(60) Provisional application No. 60/838,959, filed on Aug. 19, 2006.

(51) Int. Cl.
*G03H 1/20* (2006.01)
(52) U.S. Cl. .............. 250/504 R; 250/492.1; 250/492.2; 250/493.1; 355/53; 359/4; 359/12
(58) Field of Classification Search .......... 250/504 R, 250/492.1, 492.2; 355/53; 359/4, 12
See application file for complete search history.

(56) References Cited

U.S. PATENT DOCUMENTS

| | | | | |
|---|---|---|---|---|
| 4,340,617 | A * | 7/1982 | Deutsch et al. | 427/581 |
| 6,262,845 | B1 * | 7/2001 | Sweatt | 359/571 |
| 6,498,685 | B1 * | 12/2002 | Johnson | 359/626 |
| 6,650,421 | B2 * | 11/2003 | Magome | 356/521 |
| 6,671,054 | B2 * | 12/2003 | Goldstein | 356/450 |
| 6,704,090 | B2 * | 3/2004 | Nishi | 355/53 |
| 6,710,850 | B2 * | 3/2004 | Yamaguchi et al. | 355/53 |
| 6,710,901 | B2 * | 3/2004 | Pastor | 359/4 |
| 6,914,664 | B2 * | 7/2005 | Best et al. | 355/53 |
| 6,972,419 | B2 * | 12/2005 | Tejnil | 250/492.2 |
| 7,161,722 | B2 * | 1/2007 | Brotherton-Ratcliffe et al. | 359/12 |
| 7,251,263 | B2 * | 7/2007 | Rocca | 372/61 |
| 7,446,873 | B2 * | 11/2008 | Chandhok | 356/401 |

OTHER PUBLICATIONS

U.S. Appl. No. 11/021,217, "Increased Laser Output Energy and Average Power at Wavelengths Below 35 nm," by Jorge J. Rocca et al., filed Dec. 23, 2004.

A. Weith et al., "Continuous High-Repetition-Rate Operation of Collisional Soft X-Ray Lasers With Solid Targets," Optics Letters, pp. 1994-1996, vol. 31, No. 13, Jul. 1, 2006.

Y. Wang et al., "Demonstration of High-Repetition-Rate Tabletop Soft-X-Ray Lasers With Saturated Output Down to 13.9 nm and Gain Down to 10.9 nm," Phys. Rev. A 72, 053807 (2005).

(Continued)

*Primary Examiner*—David A Vanore
(74) *Attorney, Agent, or Firm*—Samuel M. Freund; Cochran Freund & Young LLC (57) ABSTRACT

Direct patterning of nanometer scale features by interferometric lithography using a 46.9 nm laser is described. Multiple exposures using a Lloyd's mirror interferometer permitted printing of arrays having 60 nm FWHM features.

19 Claims, 4 Drawing Sheets

OTHER PUBLICATIONS

Y. Liu et al., "Achievement of Essentially Full Spatial Coherence in a High-Average-Power Soft X-Ray Laser," Physical Review A, vol. 63, 033802 (2001).

Junarsa et al., "Hydrogen Silsesquioxane As a High Resolution Negative-Tone Resist for Extreme Ultraviolet Lithography," J. Vacuum Sci. Technol. B 23, 138 (2005).

* cited by examiner

NANOMETER-SCALE LITHOGRAPHY USING EXTREME ULTRAVIOLET/SOFT X-RAY LASER INTERFEROMETRY

RELATED CASES

The present patent application claims the benefit of Provisional Patent Application Ser. No. 60/838,959 filed on Aug. 19, 2006 entitled "Advanced EUV Laser And Techniques" by Carmen S. Menoni et al., the disclosure and teachings of which are hereby incorporated by reference herein.

STATEMENT REGARDING FEDERAL RIGHTS

This invention was made with government support under the NER program, NSF Award DMI-0508484 utilizing facilities from the Engineering Research Centers Program for Extreme Ultraviolet Science and Technology of the National Science Foundation under NSF award EEC-0310717. The government has certain rights in the invention.

FIELD OF THE INVENTION

The present invention relates generally to patterning of materials using lasers and, more particularly, to the use of extreme ultraviolet/soft x-ray laser interferometry for nanoscale lithography.

BACKGROUND OF THE INVENTION

Regular arrays of metallic or semiconductor nanoscale pillars and rings having sizes below 100 nm have recently attracted attention due to their unique optical, electrical and magnetic properties. Different strategies have been used for the fabrication of such arrays, including photon and electric beam lithography, self assembly of nanospheres or replication by embossing, molding or printing with master stamps. In the case of self assembly, the arrangement of the nanoscale structures is often random, or organized in reduced areas. The replication using master stamps has demonstrated feature sizes below 100 nm and large area coverage. However, a different master is required for each pattern, thereby restricting the versatility of the method.

An approach commonly used to print nanoscale periodic features is interferometric lithography (IL). This maskless photolithography technique is based on the activation of a photoresist by the interference pattern generated by two or more spatially coherent light beams. IL can efficiently print periodic patterns in a sensitive photoresist coated substrate with resolution approaching half of the wavelength of the illumination. In this approach, reducing the wavelength of the illumination provides a direct and simple path to realizing interference patterns having dimensions of tens of nanometers and below. This has been the principal motivation for using ultraviolet, shorter wavelength extreme ultraviolet light (EUV) or soft x-ray light (SXR) for such applications. The versatility of EUV/SXR IL for patterning different patterns and realizing small features has been demonstrated using 13 nm wavelength light from a synchrotron source. However, the widespread use of this technique in applications requires its implementation on a more compact and readily accessible apparatus.

Accordingly, it is an object of the present invention to provide an apparatus and method for patterning nanoscale features in materials by lithography using extreme ultraviolet/ soft x-ray (EUV/SXR) interferometry.

Additional objects, advantages and novel features of the invention will be set forth in part in the description that follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus for nanometer-scale lithographic patterning of a photoresist surface of a sample, hereof, including in combination: a chamber capable of being evacuated; pump means for evacuating the chamber to a chosen pressure; a source of pulsed laser radiation having a chosen wavelength in the range between 1 nm and 100 nm, and a chosen fluence, wherein the pulsed laser radiation is directed into the chamber; means disposed within the chamber for generating a chosen interference pattern at a chosen reference plane from the pulsed laser radiation and perpendicular thereto; and means for positioning the sample within the chamber at the chosen reference plane such that the photoresist surface is exposed to the interference pattern, whereby the interference pattern is generated on the photoresist surface of the sample.

In another aspect of the present invention, and in accordance with its objects and purposes, the method for nanometer-scale lithographic patterning of a photoresist surface of a sample, hereof, includes the steps of: directing pulsed laser radiation having a chosen wavelength in the range between 1 nm and 100 nm and a chosen intensity into a vacuum chamber below atmospheric pressure; generating a chosen interference pattern at a chosen reference plane from the pulsed laser radiation and perpendicular thereto; and exposing the photoresist surface of the sample to the interference pattern in the reference plane in the vacuum chamber, whereby the interference pattern is generated on the photoresist surface of the sample.

Benefits and advantages of the present invention include, but are not limited to, an apparatus and method for generating a variety of patterns with features having sizes below about 60 nm in photosensitive materials.

BRIEF DESCRIPTION OF THE DRAWINGS

The accompanying drawings, which are incorporated in and form a part of the specification, illustrate embodiments of the apparatus of the present invention and, together with the description, serve to explain the principles of the invention. In the drawings:

FIG. 2 is a diagram of a flat mirror disposed in Lloyd's configuration, showing the relative locations of the light source, the mirror and the sample, and the parallel-line interference pattern generated thereby.

FIG. 3A is a schematic representation of the use of the Lloyd's configuration mirror shown in FIG. 2 hereof to obtain a parallel line pattern in the photoresist material on a sample, while

DETAILED DESCRIPTION OF THE INVENTION

Extreme ultraviolet electromagnetic radiation for the purposes hereof corresponds to wavelengths between about 55 nm and 150 nm, while soft x-ray electromagnetic radiation corresponds to wavelengths between about 1 nm and 55 nm. While the invention is not restricted to this source of laser radiation, the capillary discharge x-ray laser used for the EXAMPLES of the present invention is described in U.S. Pat. No. 7,251,263 for "Capillary Discharge X-Ray Laser" which issued to Jorge J. Rocca on Jul. 31, 2007, hereinafter the '263 patent, the disclosure and teachings of which are hereby incorporated by reference herein. Recently developed EUV/SXR lasers provide wavelengths between 13 nm and 47 nm. For example, see A. Weith et al. in "Continuous High-Repetition-Rate Operation Of Collisional Soft X-Ray Lasers With Solid Targets," Optics Lett. 31, (2006), Y. Wang et al., "Demonstration Of High-Repetition-Rate Tabletop Soft-X-Ray Lasers With Saturated Output Down To 13.9 nm And Gain Down To 10.9 nm," Phys. Rev. A 72, 053807 (2005), and U.S. patent application Ser. No. 11/021,217 for "Increased Laser Output Energy And Average Power At Wavelengths Below 35 nm" by Jorge J. Rocca et al. which was filed on Dec. 23, 2004.

Laser fluence may be controlled by passing the laser radiation through a gas having a chosen pressure of atoms with ionization potentials less than the energy of the laser photons.

Briefly, the present invention includes the use of EUV/SXR pulsed laser radiation from a discharge-pumped EUV/SXR laser for nanoscale lithography patterning by interferometry. High contrast interference patterns were generated over large areas. As will be described in detail in the EXAMPLES set forth hereinbelow, patterns having clean, nanoscale features were created in poly-methyl methacrylate (PMMA) and in hydrogen silsesquioxane (HSQ) by directing the 46.9 nm wavelength output from the capillary discharge laser described in the '263 patent, into means for generating two coherent beams of light intersecting at a chosen angle and producing an interference pattern in a plane. The short wavelength of the illumination source at 46.9 nm and its high degree of spatial coherence were exploited for nanoscale patterning applications to generate nominal 60 nm feature sizes over areas as large as 500×500 $\mu m^2$. It is expected that the use of $\lambda=13.9$ nm EUV/SXR light will permit patterns to be generated at the limit of the photosensitive materials having dimensions below 20 nm.

Multiple exposure interferometric lithography, IL, has also been demonstrated using a $\lambda=46.9$ nm capillary discharge EUV/SXR laser. Arrays of cone-shaped nanoscale features having 60 nm full-width-at-half-maximum, FWHM, and a periodicity of 150 nm were printed using an exposure time of less than 1 min. The heights of the nanoscale pillars was limited to approximately 25 nm due to the short penetration depth of the 46.9 nm photons in the carbon-containing photoresist materials employed.

In its simplest form, IL uses two mutually coherent beams having wavelength $\lambda$ intersecting at an angle of $2\theta$, and interfering at a reference plane. This generates a modulated light intensity pattern having a period of $d=\lambda/2 \sin \theta$ which is used to expose a sensitive photoresist coated sample that after processing defines templates of nanoscale features having periods which approach $\lambda/2$.

Figure 1:
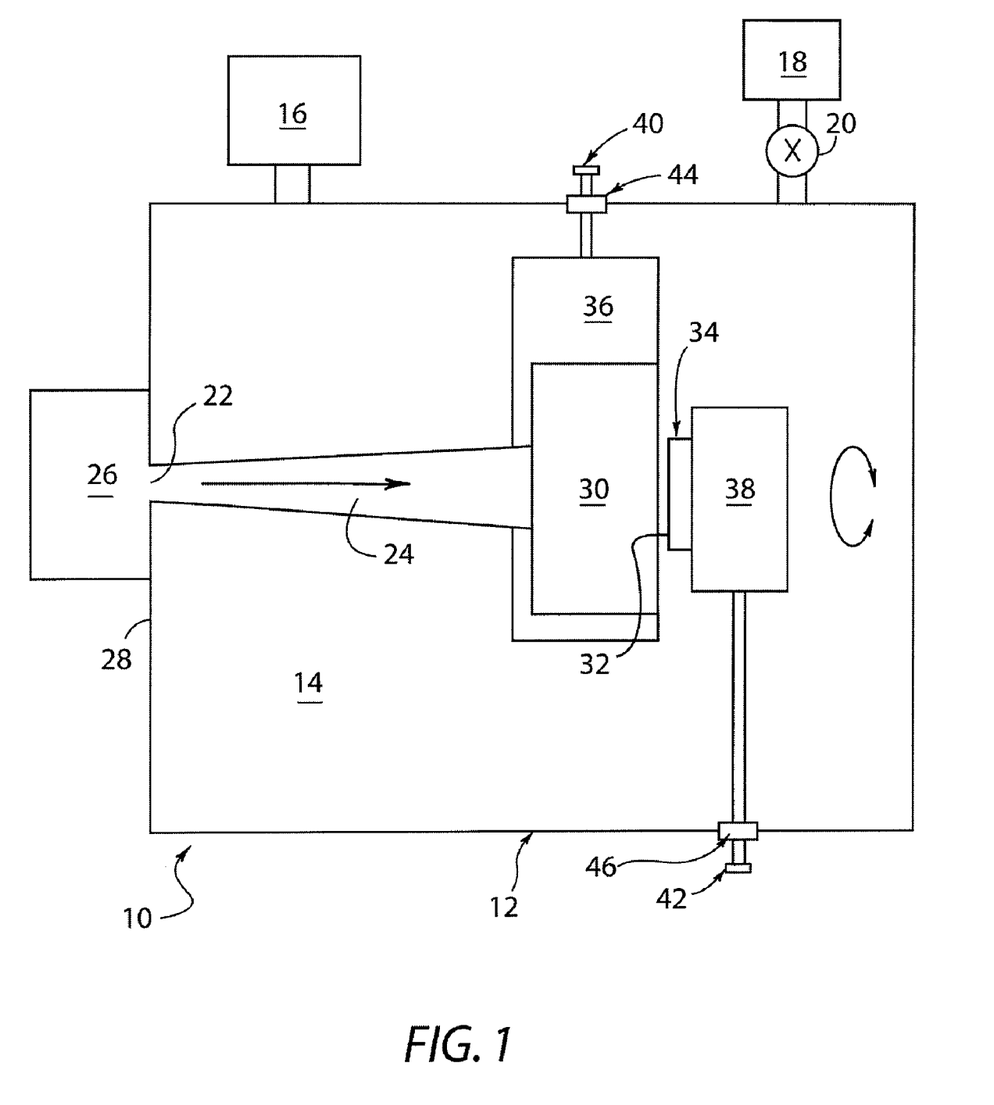
FIG. 1 is a diagram of one embodiment of the EUV/SXR photolithography apparatus of the present invention showing the evacuated target chamber of the EUV/SXR laser containing the means for generating an interference pattern in a plane, the target having a photosensitive material coated surface located in the plane or a solid photosensitive target, and means for positioning the means for generating the interference pattern and the target from the outside of the vacuum chamber.

Reference will now be made in detail to the present embodiments of the present invention, examples of which are illustrated in the accompanying drawings. In the drawings, similar or identical structure is identified using identical callouts. Turning now to the FIGURES, FIG. 1 is a schematic representation of a side view of one embodiment of the nanometer-scale lithographic patterning apparatus, 10, of the present invention. Shown are chamber, 12, having interior volume, 14, which may be located in a similar position to chamber 56 relative to discharge capillary 13 in FIG. 1A of the '263 patent. Pump, 16, is used to evacuate chamber 12 to a chosen pressure, while gas source, 18, is used to introduce gases into volume 14 of chamber 12 through valve, 20. In the situation where an EUV/SXR laser of the type described in the '263 patent is employed, chamber 12 may be differentially pumped by pump 16 through hole, 22. Laser fluence may be controlled by introducing argon atoms at a chosen pressure into chamber 12. As stated hereinabove, any gaseous atoms having ionization potentials lower than 26.4 eV, may be employed in the situation where the '263 laser operating on argon atoms is used as the EUV/SXR radiation source.

Pulsed, coherent EUV/SXR radiation, 24, from EUV/SXR source, 26, enters chamber 12 through hole, 22, in the wall, 28, thereof, and impinges on interference pattern generating means, 30, which generates an interference pattern, 32, onto the surface of sample, 34. Micromanipulators, 36 and 38, are used to position interference pattern generating means 30 and sample 34, respectively. For example, as will be described hereinbelow, it may be desirable to rotate the sample about an axis perpendicular to the surface thereof (micromanipulator 38), and the mirrors described in the embodiments of FIGS. 2 and 6 hereof as part of interference pattern generating means 30 may require tilting (micromanipulator 36). Micromanipulators 36 and 38 may be operated by devices 40 and 42, respectively, which extend through wall 28 by means of vacuum feed-throughs, 44 and 46, respectively, or may be controlled electronically from the outside of chamber 12 (not shown in FIG. 1).

The illumination source utilized in what follows hereinbelow was a high-brightness, $\lambda=46.9$ nm Ne-like Ar capillary discharge EUV/SXR laser configured to generate pulses having sufficient energy to activate the photosensitive material, and about 1.2 ns FWHM duration, and described in the '263 patent. When operated at repetition rates of several Hz the laser produces EUV/SXR beams having average powers in excess of 1 mW with a high degree of spatial and temporal coherence [See, e.g., Y. Liu et al., "Achievement Of Essentially Full Spatial Coherence In A High-Average-Power Soft X-Ray Laser," Phys. Rev. A 6303, 033802 (2001).]. The 27 cm-long capillary discharge plasma columns used generate a laser beam that has a spatial coherence length of approximately 570 $\mu m$ measured at a chamber located 1.7 m from the exit of the laser. The spatial coherence length can be further increased by using a longer plasma length. The laser beam temporal coherence is greater than 470 µm as determined by its line width $\Delta\lambda/\lambda < 1 \times 10^{-4}$.

Figures 2, 3A:
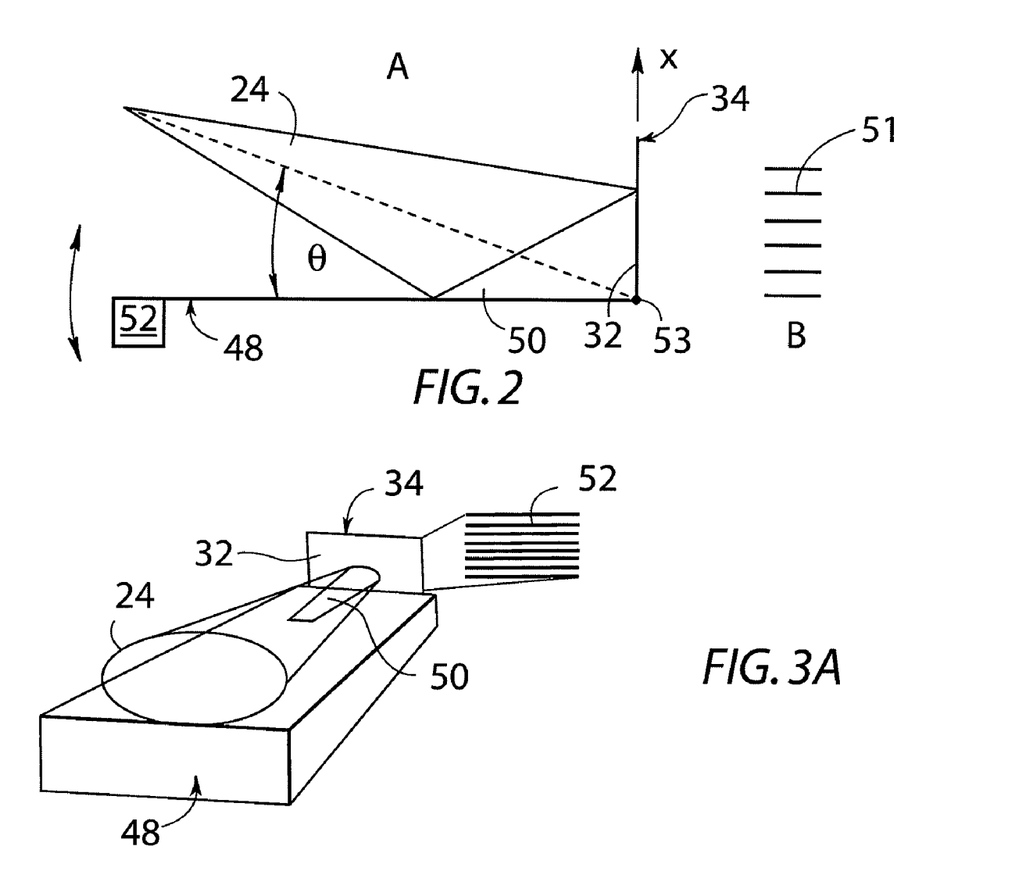

FIG. 2 is a diagram of one embodiment of the interferometric lithography apparatus of the present invention showing the illuminating flat mirror, 48, disposed in the Lloyd configuration with respect to EUV/SXR laser output 24. In this configuration, part of the laser beam impinges on the mirror at an angle of incidence, θ, and is reflected such that the reflected portion, 50, interferes with the remaining undeflected portion of beam 24 forming an interference pattern on photosensitive surface 32 of sample 34. Sample 34 may have a coated photosensitive surface or may be photosensitive itself. As stated hereinabove, beam interference gives rise to a sinusoidal intensity pattern, 51, having period, d, defined by the wavelength of the light, λ, and the angle of incidence θ in accordance with $d = \lambda/2 \sin\theta$ as illustrated in FIG. 2(*b*). Mirror 48 was a rectangular, chromium-coated flat mirror (other metallic coatings are suitable as well) mounted at grazing incidence in front of the laser beam on pivoting platform, 52, with its axis coincident with the intersection, 53, of mirror 48 with the plane of sample 34. Sample, 34 including a Si wafer coated with poly(methyl methacrylate) (PMMA), was mounted at this edge of mirror 48 on a motorized rotation/translation stage 38 (See, FIG. 1 hereof). Clearly, other flat substrates may be employed, depending on the purpose of the photosensitive material processing.

Controlled rotation by a chosen angle, α, around an axis normal to the sample's surface allows for multiple exposures generating many patterns. Rotation/translation stage 38 retracts the sample from the mirror edge before each rotation, and is mounted on motorized pivoting platform 52 for changing the incidence angle, θ. Lloyd mirror interferometer system 30 was housed in a vacuum chamber 12, having dimensions $0.45 \times 0.55 \times 0.40$ m$^3$ that was differentially pumped with respect to laser 26 in order to maintain a pressure of approximately $10^{-5}$ Torr.

Having generally described the invention, the following EXAMPLES provide greater detail.

Example 1

Figure 3B:
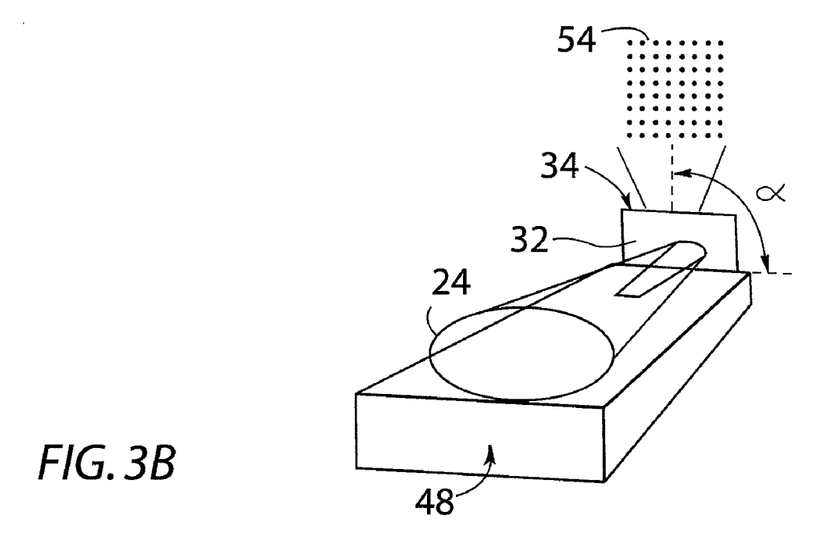
FIG. 3B is a schematic representation of the process for obtaining different patterns from the parallel line interference pattern by rotating the sample in the plane of the interference pattern.

To pattern an array, a PMMA-coated sample was initially exposed to produce an interference pattern consisting of regular lines parallel to the mirror's edge. See FIG. 3A hereof. This was followed by a second exposure in which the sample was rotated in situ by an angle $\alpha = \pi/2$ (FIG. 3B). This procedure was carried out without the requirement of breaking vacuum in chamber 12, thereby assuring similar conditions for both exposures. Typical exposure times of 30-50 s were used to print periodic patterns over surface areas of $500 \times 500$ µm$^2$. Ultra-thin photoresist layers, approximately 30 nm thick, were deposited on the sample to match the thickness of the photoresist layer to the penetration depth of the 46.9 nm wavelength in PMMA, thereby allowing the photolithography pattern to reach the substrate. This was accomplished by spin coating the substrate with diluted 1% PMMA in Anisole at 5000 RPM in a commercially available spin coater. After the exposure, the PMMA was developed using the standard procedure consisting of immersion in a 1:3 solution of MIBK-methyl isobutyl ketone (4-Methyl-2-Pentanone) with IPA-isopropyl alcohol for 35 s, followed by rinsing with IPA. The sample was subsequently dried using compressed nitrogen.

The photon dose applied in each exposure, calculated as the energy per unit area, allows an extra degree of control over the shape of the features imprinted. The thickness of photoresist remaining in the exposed areas after the development process (residual thickness) is a linear function of the applied dose. For a dose of 10 mJ/cm$^2$, which can be obtained with about 20 laser pulses, it was found that the photoresist was only activated along lines coincident with the interference maxima, leaving small regions where small holes were developed at the crossing points.

Figure 4:
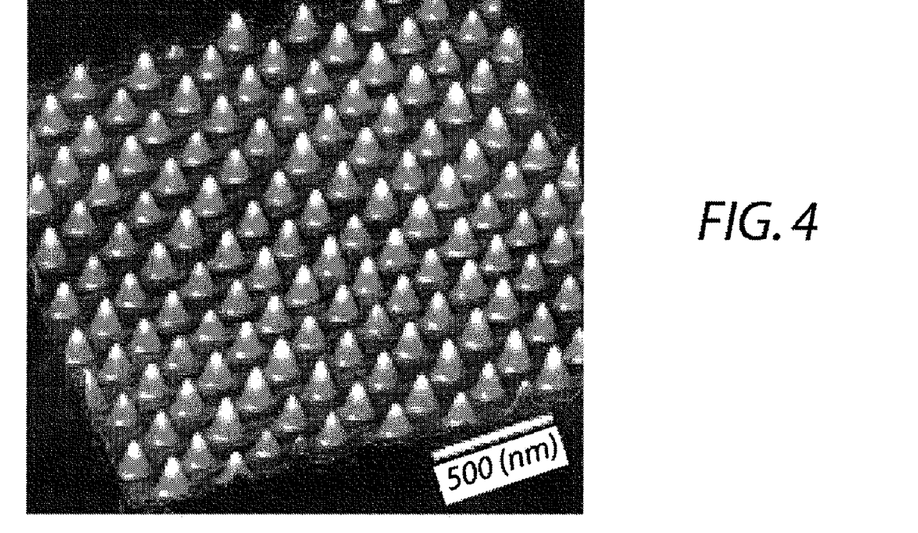
FIG. 4 shows an atomic force microscopy scan of a poly (methyl methacrylate) photoresist material after double exposure using the Lloyd's mirror configuration shown in FIGS. 2, 3A and 3B hereof.

If the applied dose is increased to 32 mJ/cm$^2$, the loci in the sample surface with sufficient exposure to activate the photoresist are broader. After development a regular array of trenches in two perpendicular directions was generated, leaving small non-activated spots at the intersections. FIG. 4 shows a regular array of cone-shaped dots resulting from the irradiation. A $1.4 \times 1.4$ µm$^2$ section of the total printed surface was scanned using an atomic force microscope (AFM) used in tapping mode with a 10 nm tip size cantilever. The 150 nm period, can be continuously changed by varying the angle of incidence θ. The FWHM of the features is approximately 60 nm. The height of the cones corresponds to the penetration depth of the 46.9 nm wavelength of the laser light in the PMMA of approximately 30 nm.

Example 2

Figure 5:
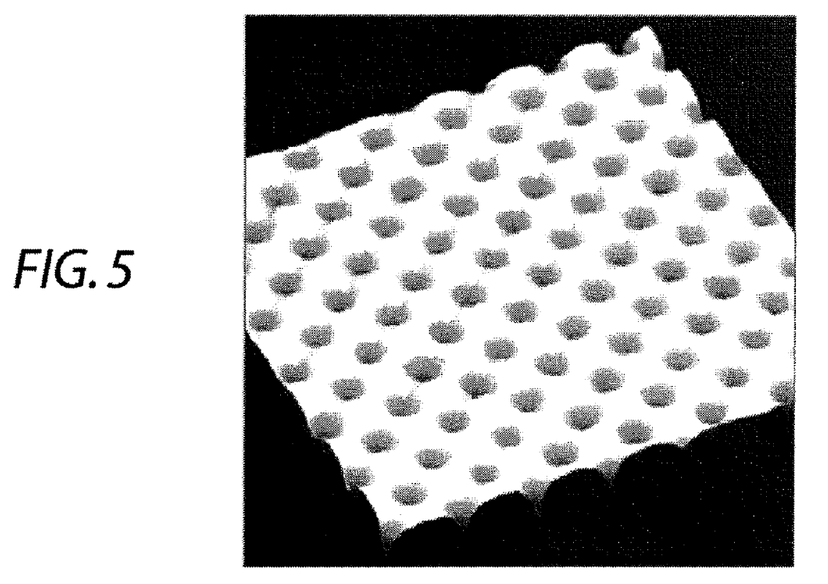
FIG. 5 shows an atomic force microscopy scan of a hydrogen silses-quioxane photoresist material after double exposure using the Lloyd's mirror configuration shown in FIGS. 2, 3A and 3B hereof.

When the silicon-based photoresist hydrogen silses-quioxane, HSQ, is used, larger aspect ratio features can be printed. Exposing HSQ to a photon flux of 13 mJ/cm$^2$, the photoresist was activated along wide regions coincident with the interference maxima. Upon development (See, e.g., Junarsa et al., "Hydrogen Silsesquioxane As A High Resolution Negative-Tone Resist For Extreme Ultraviolet Lithography," J. Vacuum Sci. Technol. B 23, 138 (2005).), arrays of small holes were obtained at the cross points. FIG. 5 shows an array of holes having 130 nm FWHM and greater than 120 nm depth. If the applied flux was decreased to approximately 8 mJ/cm$^2$, the loci at the sample surface with sufficient exposure to activate the photoresist were restricted to small spots corresponding to the intersections of the maxima of interferences in each of the two exposures, forming a pattern of pillars instead of holes.

In summary, nanometer-scale patterning has been achieved using laser interferometric lithography. Using a multiple exposure Lloyd's mirror configuration, dense arrays of holes and nanometer-scale dots with feature sizes as small as 60 nm were imprinted in PMMA over areas in excess of $500 \times 500$ µm$^2$ using a 46.9 nm wavelength laser. The periodicity of the structures can be controlled by changing the incidence angle of the light beam at the mirror, while the minimum size of the features can be varied by changing the applied dose.

Figure 6:
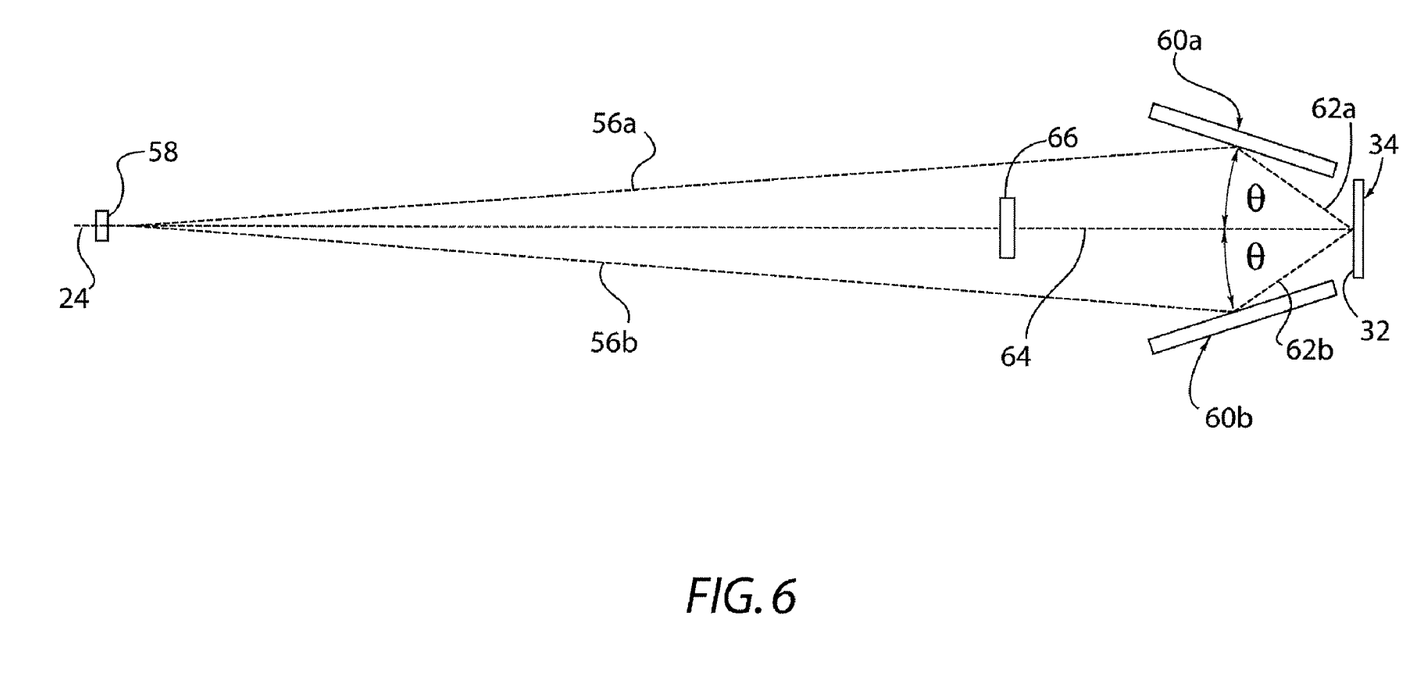
FIG. 6 is a diagram of a folding mirror embodiment of the interferometer which in cooperation with a EUV/SXR laser may be used to generate lithographic patterns in a sample.

In another embodiment of the invention, two mutually coherent light beams, 56*a* and 56*b*, generated by splitting input beam 24 using diffraction grating, 58, that upon reflection in the folding mirrors, 60*a* and 60*b*, interfere at the sample plane 32. Light emerging from grating 58 along optical axis, 64, is blocked by beamstop, 66. This approach is an amplitude division configuration that has relaxed spatial coherence requirements as compared with the front division configurations of Lloyd's mirror used in the EXAMPLES, and represents an advantage because it will allow the printing of larger areas, limited only by the size of the diffraction grating beam splitter. Furthermore, two interference beams having equal intensity which will generate interference fringes with maximum contrast are produced. After initial alignment, the system is expected to be robust. The precision equalizing of the optical paths of the two beams will be limited by the longitudinal coherence of the laser source (a fraction of a millimeter). The accuracy in the overlapping of the two beams at the sample's surface will be limited by the spatial coherence of the beams, which for λ=46.9 nm is in the range of millimeters.

High quality transmission gratings will be fabricated by contact photolithography and etching with periods as low as 1 µm, or e-beam lithography on a silicon membrane. With a thickness in the range between 100 nm to 200 nm, Si membranes provide greater than 40% transparency around 13 nm and 46.9 nm regions [See, e.g., Center for X-Ray Optics. http://www.cxro.lbl.gov.]. With diffraction gratings having 1 µm period, it may be possible to implement an interferometric lithography tool having a footprint of 40×15 $cm^2$ and capable of printing several square millimeters of the photoresist with nanometer-size features in tens of seconds.

Arrays of nanoscale structures having different shapes will be printed by double exposure of the sample after a rotation around an axis perpendicular to the sample surface. The period of these patterns may be varied by changing the incidence angle of the two beams on the sample by simultaneously tilting the two folding mirrors, thereby adjusting the sample position. All optics movements will be automatically performed under vacuum using precision translation and rotation stages. The apparatus will be equipped with overlay capabilities using high-precision piezoelectric-driven translation stages.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for nanometer-scale lithographic patterning of a photosensitive surface of a sample, comprising in combination:
   a chamber capable of being evacuated;
   pump means for evacuating said chamber to a chosen pressure;
   a source of pulsed laser radiation having a chosen wavelength in the range between 1 nm and 100 nm, and a chosen fluence, wherein the pulsed laser radiation is directed into said chamber;
   means disposed within said chamber for generating a chosen interference pattern at a chosen reference plane from the pulsed laser radiation and perpendicular thereto; and
   means for positioning said sample within said chamber at the chosen reference plane such that the photosensitive surface is exposed to the interference pattern, whereby the interference pattern is generated on the photosensitive surface of said sample.

2. The apparatus described in claim 1, wherein said means for generating an interference pattern forms two mutually coherent light beams having a chosen angle of intersection at the reference plane from the pulsed laser radiation.

3. The apparatus described in claim 2, wherein said means for generating an interference pattern comprises a flat mirror disposed in a Lloyd configuration.

4. The apparatus described in claim 2, wherein said means for generating an interference pattern comprises: a diffraction grating for receiving the pulsed laser radiation and for splitting the laser radiation into a first light beam and a second light beam, the first light beam and the second light beam being mutually coherent; a beam stop for blocking light emerging from said grating not included in said first light beam and said second light beam; a first folding mirror for receiving the first light beam and reflecting the first light beam in a first chosen direction; and a second, opposing folding mirror for receiving the second light beam and reflecting the second light beam in a second chosen direction, whereby the first light beam and the second light beam interfere at the reference plane.

5. The apparatus described in claim 1, wherein said means for positioning said sample within said chamber at the chosen reference plane such that the photoresist surface is exposed to the interference pattern, further comprises means for rotating said photoresist surface of said sample a chosen angle in the reference plane.

6. The apparatus described in claim 5, wherein said lithographic pattern comprises the periodic structures in said photosensitive material surface of said sample comprise parallel lines resulting from a chosen number of first laser pulses, the photosensitive material surface of said sample then being rotated a chosen angle with respect to the parallel lines and exposed a chosen number of second laser pulses.

7. The apparatus described in claim 6, wherein the chosen angle is 90°.

8. The apparatus described in claim 1, wherein said source of laser radiation comprises a capillary discharge x-ray laser.

9. The apparatus described in claim 8, wherein the chosen wavelength comprises 46.9 nm from the 26.4 eV transition of neon-like Ar ions.

10. The apparatus described in claim 9, wherein the chosen fluence of said source of pulsed laser radiation is controlled by passing the pulsed laser radiation through atoms at a chosen pressure having a lower ionization energy than 26.4 eV.

11. A method for nanometer-scale lithographic patterning of a photoresist surface of a sample, comprising the steps of:
    directing pulsed laser radiation having a chosen wavelength in the range between 1 nm and 100 nm and a chosen intensity into a vacuum chamber below atmospheric pressure;
    generating a chosen interference pattern at a chosen reference plane from the pulsed laser radiation and perpendicular thereto; and
    exposing the photosensitive surface of the sample to the interference pattern in the reference plane in the vacuum chamber, whereby the interference pattern is generated on the photoresist surface of said sample.

12. The method described in claim 11, wherein said step of generating an interference pattern is achieved by forming two mutually coherent light beams having a chosen angle of intersection at the reference plane from the pulsed laser radiation.

13. The method described in claim 12, wherein said step of forming two mutually coherent light beams having a chosen angle of intersection at the reference plane comprises using a flat mirror disposed in a Lloyd configuration.

14. The method described in claim 12, wherein said step of forming two mutually coherent light beams having a chosen angle of intersection at the reference plane comprises splitting the pulsed laser radiation into a first light beam and a second light beam using a diffraction grating, the first light beam and the second light beam being mutually coherent; and recombining the first light beam and the second light beam using a first folding mirror and a second folding mirror, respectively, whereby the first light beam and the second light beam interfere at the reference plane.

15. The method described in claim 12, further comprising the steps of choosing the angle of intersection of the light beams at the reference plane to achieve a desired periodicity of said patterning; and selecting the chosen intensity the pulsed laser radiation to achieve desired dimensions of said patterning.

16. The method described in claim 12, wherein said step of exposing the photoresist surface of the sample to the interference pattern further comprises rotating the photoresist surface of the sample a chosen angle in the reference plane between exposing steps.

17. The method described in claim 16, wherein the chosen angle is 90°.

18. The method described in claim 12, wherein said step of directing pulsed laser radiation comprises using a capillary discharge x-ray laser, wherein the chosen wavelength comprises 46.9 nm from the 26.4 eV transition of neon-like Ar ions.

19. The method described in claim 18, wherein the chosen fluence is controlled by passing the pulsed laser radiation through atoms at a chosen pressure having a lower ionization energy than 26.4 eV.

* * * * *